(12) United States Patent
Lin et al.

(10) Patent No.: US 10,667,424 B2
(45) Date of Patent: *May 26, 2020

(54) SLIDING APPARATUS AND SERVER CASING USING THE SAME

(71) Applicant: HONGFUJIN PRECISION ELECTRONICS (TIANJIN) CO., LTD., Tianjin (CN)

(72) Inventors: Chieh-Hsiang Lin, New Taipei (TW); Wen-Chen Wang, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/921,609

(22) Filed: Mar. 14, 2018

(65) Prior Publication Data

US 2019/0174648 A1    Jun. 6, 2019

(30) Foreign Application Priority Data

Dec. 5, 2017 (CN) .......................... 2017 1 1274604

(51) Int. Cl.
H05K 7/14 (2006.01)
(52) U.S. Cl.
CPC ......... H05K 7/1489 (2013.01); H05K 7/1411 (2013.01)
(58) Field of Classification Search
CPC .................... H05K 7/1489; H05K 7/1411
See application file for complete search history.

(56) References Cited

U.S. PATENT DOCUMENTS

| | | | | |
|---|---|---|---|---|
| 3,133,768 A | * | 5/1964 | Klakovich | H05K 7/1421 384/17 |
| 6,601,933 B1 | * | 8/2003 | Greenwald | H05K 7/1489 312/330.1 |
| 6,945,619 B1 | * | 9/2005 | Chen | A47B 88/487 312/334.47 |
| 7,413,269 B2 | * | 8/2008 | Chen | A47B 88/493 312/333 |
| 8,317,278 B2 | * | 11/2012 | Enos | A47B 88/493 312/333 |

(Continued)

FOREIGN PATENT DOCUMENTS

CN            104536540 A       4/2015

*Primary Examiner* — Stanton L Krycinski
(74) *Attorney, Agent, or Firm* — ScienBiziP, P.C.

(57) ABSTRACT

A server casing using a sliding apparatus for blade servers includes a chassis and the sliding apparatus. The chassis includes a blocking member. The sliding apparatus includes a first fastening plate, a second parallel fastening plate mounted to the first fastening plate, and a sliding plate configured to be slidably connected to the second fastening plate. The sliding plate is received between the first fastening plate and the second fastening plate and a locking member includes a first end and a second end. The first end is rotatably connected to the second fastening plate and includes a locking portion, the second end is connected to the sliding plate. The locking portion can move between a locking position, where the locking member is locked by the blocking member, and an unlocking position, where the locking member is unlocked by the blocking member.

17 Claims, 6 Drawing Sheets

(56) References Cited

U.S. PATENT DOCUMENTS

| | | | |
|---|---|---|---|
| 8,403,436 B2* | 3/2013 | Yu | H05K 7/1489 |
| | | | 312/333 |
| 8,848,378 B2* | 9/2014 | Liao | G06F 1/181 |
| | | | 248/224.8 |
| 9,107,321 B2* | 8/2015 | Yin | H05K 7/1489 |
| 9,198,323 B1* | 11/2015 | Chen | F16C 29/04 |
| 9,211,003 B1* | 12/2015 | Chen | H05K 7/1489 |
| 9,247,814 B2* | 2/2016 | Chen | A47B 88/493 |
| 9,326,603 B2* | 5/2016 | Iwamoto | H05K 7/1489 |
| 9,380,872 B2* | 7/2016 | Yoneda | H05K 7/1489 |
| 9,386,721 B2* | 7/2016 | Hsu | H05K 7/1489 |
| 9,557,782 B2* | 1/2017 | Hsu | G06F 1/182 |
| 9,629,459 B2* | 4/2017 | Chen | H05K 7/1489 |
| 9,670,956 B2* | 6/2017 | Judge | F16C 29/04 |
| 9,681,573 B2* | 6/2017 | Chen | H05K 7/1489 |
| 9,681,574 B1* | 6/2017 | Chen | H05K 7/1489 |
| 9,693,628 B2* | 7/2017 | Chen | H05K 7/1489 |
| 9,723,746 B2* | 8/2017 | Chen | H05K 7/1489 |
| 9,894,798 B2* | 2/2018 | Chen | H05K 7/183 |
| 9,918,404 B1* | 3/2018 | Chen | A47B 88/43 |
| 10,028,406 B2* | 7/2018 | Chen | H05K 7/183 |
| 10,149,538 B2* | 12/2018 | Chen | A47B 88/43 |
| 10,194,556 B2* | 1/2019 | Chen | A47B 88/423 |
| 10,213,017 B2* | 2/2019 | Chen | H05K 7/1489 |
| 10,274,009 B2* | 4/2019 | Chen | F16C 29/10 |
| 10,292,297 B2* | 5/2019 | Chen | A47B 88/423 |
| 10,306,983 B2* | 6/2019 | Chen | H05K 7/1489 |
| 10,349,741 B2* | 7/2019 | Chen | A47B 88/43 |
| 10,368,460 B1* | 7/2019 | Yang | H05K 7/1489 |
| 2016/0369844 A1* | 12/2016 | Ito | A47B 88/493 |
| 2018/0199714 A1* | 7/2018 | Chen | A47B 88/75 |
| 2019/0090634 A1* | 3/2019 | Chen | A47B 88/467 |

\* cited by examiner

SLIDING APPARATUS AND SERVER CASING USING THE SAME

FIELD

The subject matter herein generally relates to sliding apparatus and server casing using the sliding apparatus.

BACKGROUND

Blade servers deal with great amounts of data. The so-called "Server Blade" refers to an entire server designed to fit on a small plug-and-play card. Several blade servers can be installed in one rack, sharing the same power supplies, monitor, keyboard and other electronic components while offering potentially easier maintenance. However, large operating space is always needed to lock or unlock the blade servers. Therefore, sliding apparatus and casing using the sliding apparatus that can save operating space would be beneficial.

BRIEF DESCRIPTION OF THE DRAWINGS

Implementations of the present disclosure will now be described, by way of example only, with reference to the attached figures.

DETAILED DESCRIPTION

Figure 1:
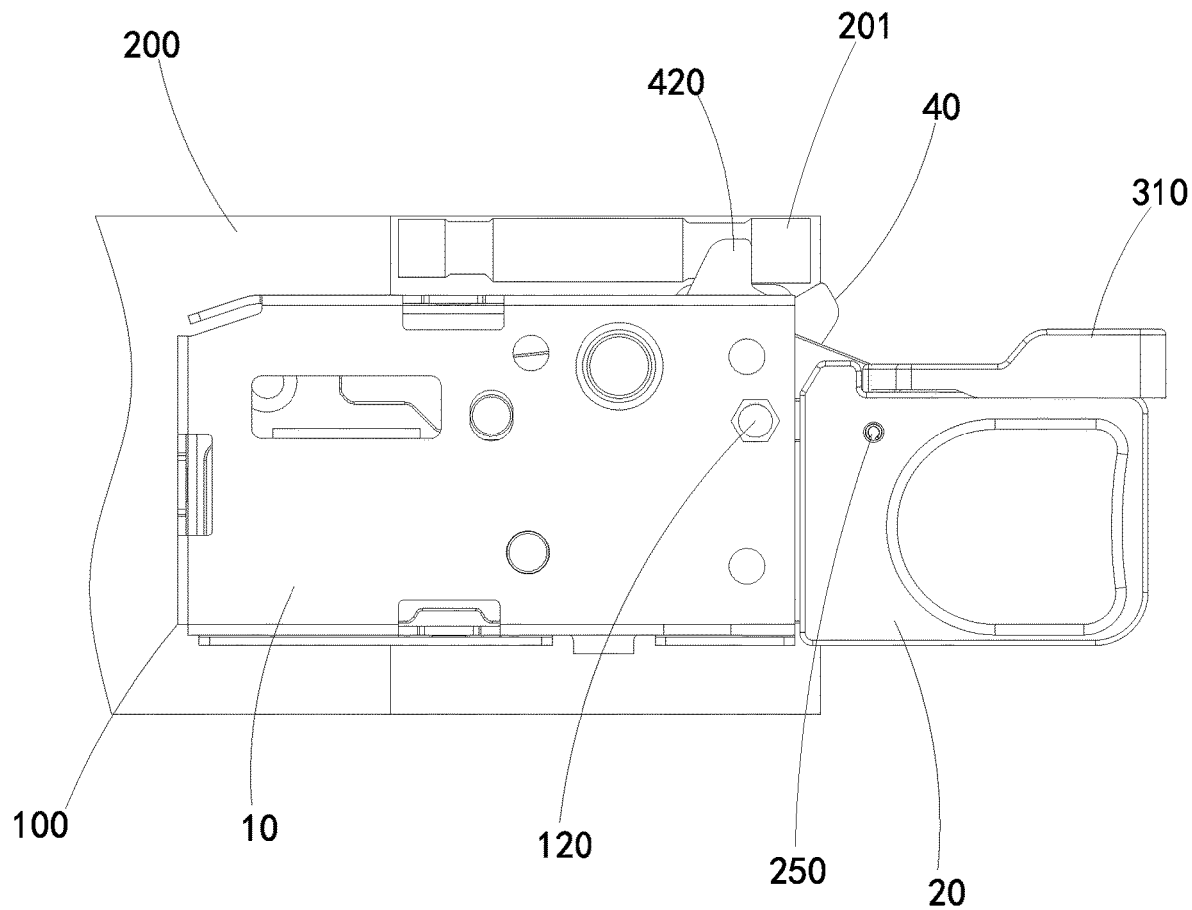
FIG. 1 illustrates an isometric view of an exemplary embodiment of a casing.
Figure 2:
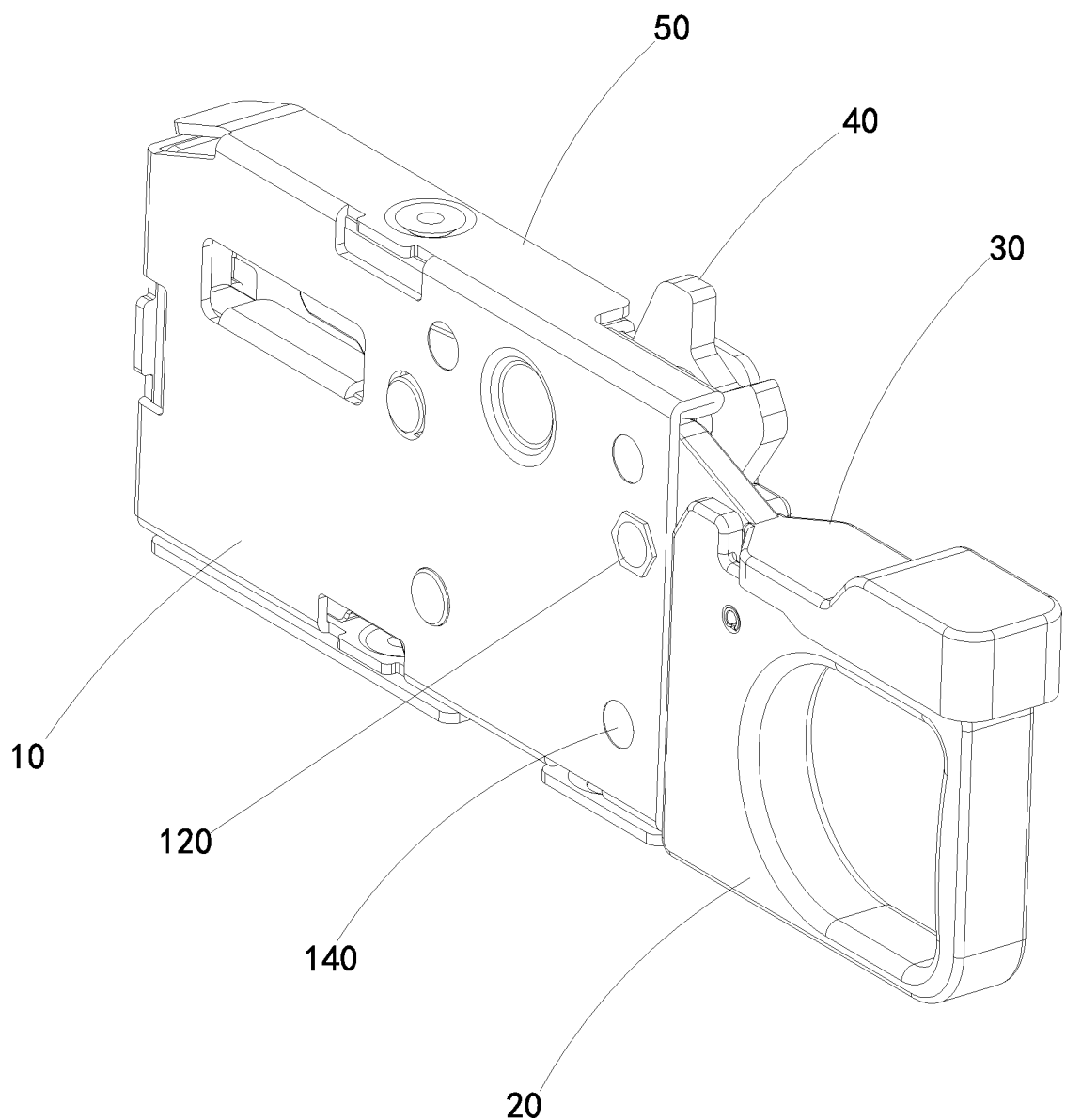
FIG. 2 illustrates isometric view of the sliding apparatus of the casing of FIG. 1.
Figure 3:
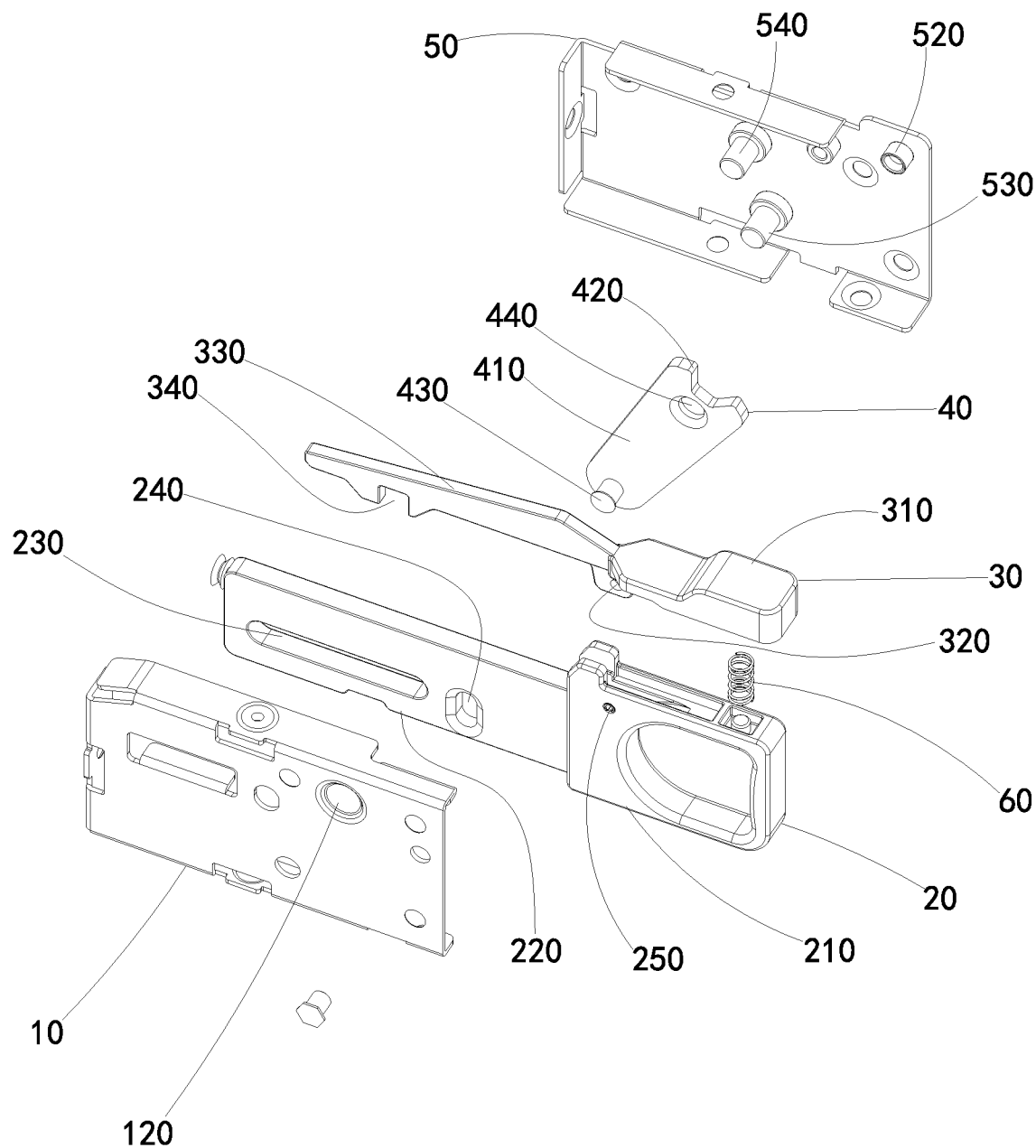
FIG. 3 illustrates an exploded view of the sliding apparatus of FIG. 2.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

FIG. 1 illustrates a casing 500. The casing 500 includes a chassis 200 and a sliding apparatus 100. The chassis 200 can include a blocking member 201. The sliding apparatus 100 can slide into or slide out of the chassis 200. For example, an electronic component (not shown), such as a storage device or a blade server, can be fixed to the sliding apparatus 100. The sliding apparatus 100 can slide into or slide out of the chassis 200 to plug the electronic component to the chassis or unplug and extract the electronic component out of the chassis 200.

Referring also to FIGS. 2 to 6, the sliding apparatus 100 can include a first fastening plate 10, a second fastening plate 50, a sliding plate 20, and a locking member 40.

The second fastening plate 50 can be parallel with the first fastening plate 10 and mounted to the first fastening plate 10.

The sliding plate 20 is configured to be slidably connected to the second fastening plate 50 and be received between the first fastening plate 10 and the second fastening plate 50.

The locking member 40 can include a first end and a second end opposing to the first end. The first end of the locking member 40 is rotatably connected to the second fastening plate 50, and the first end of the locking member 40 includes a locking portion 420. The second end of the locking member 40 is connected to the sliding plate 20.

Figure 4:
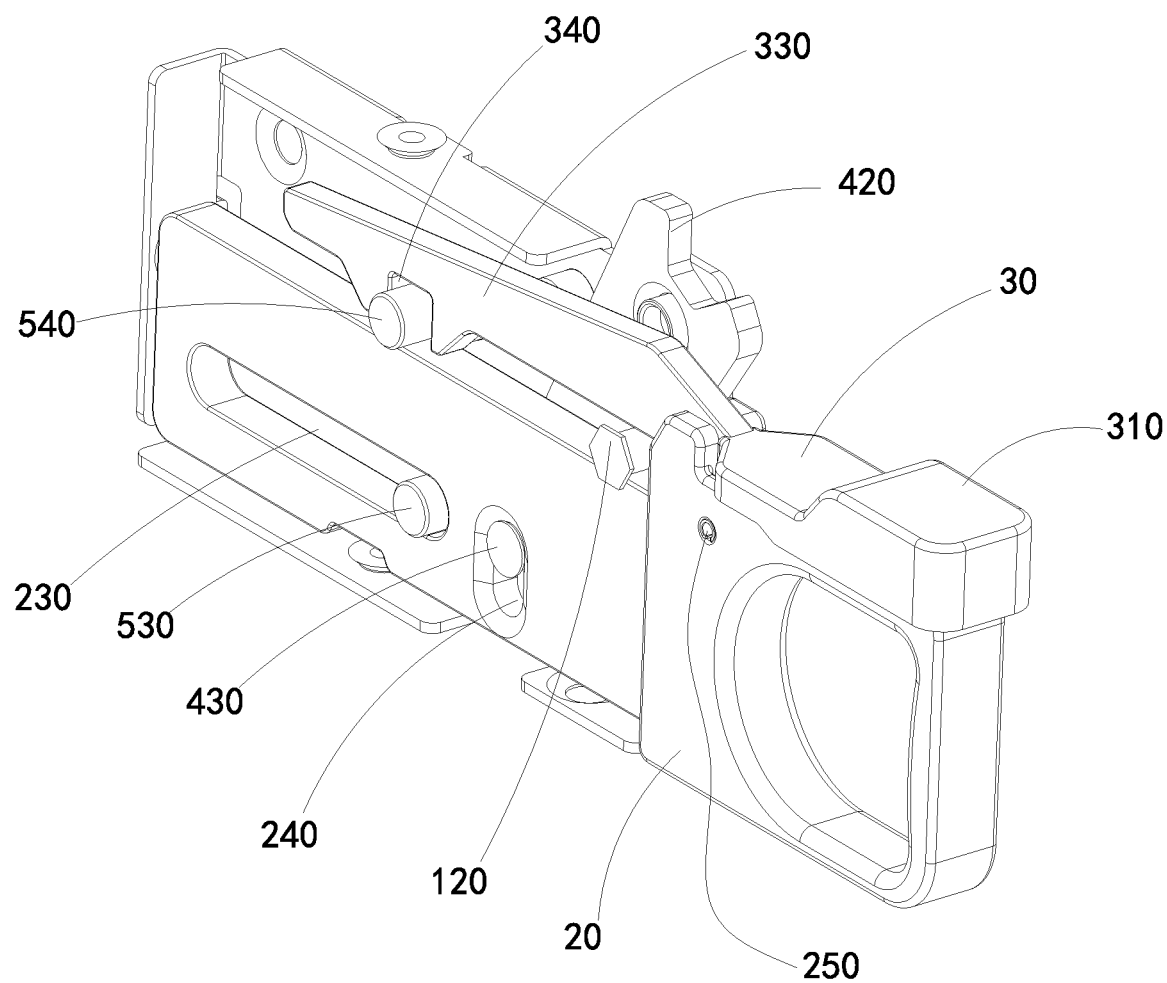
FIG. 4 illustrates a partial view of the sliding apparatus of FIG. 2, the sliding apparatus being in a first state.
Figure 5:
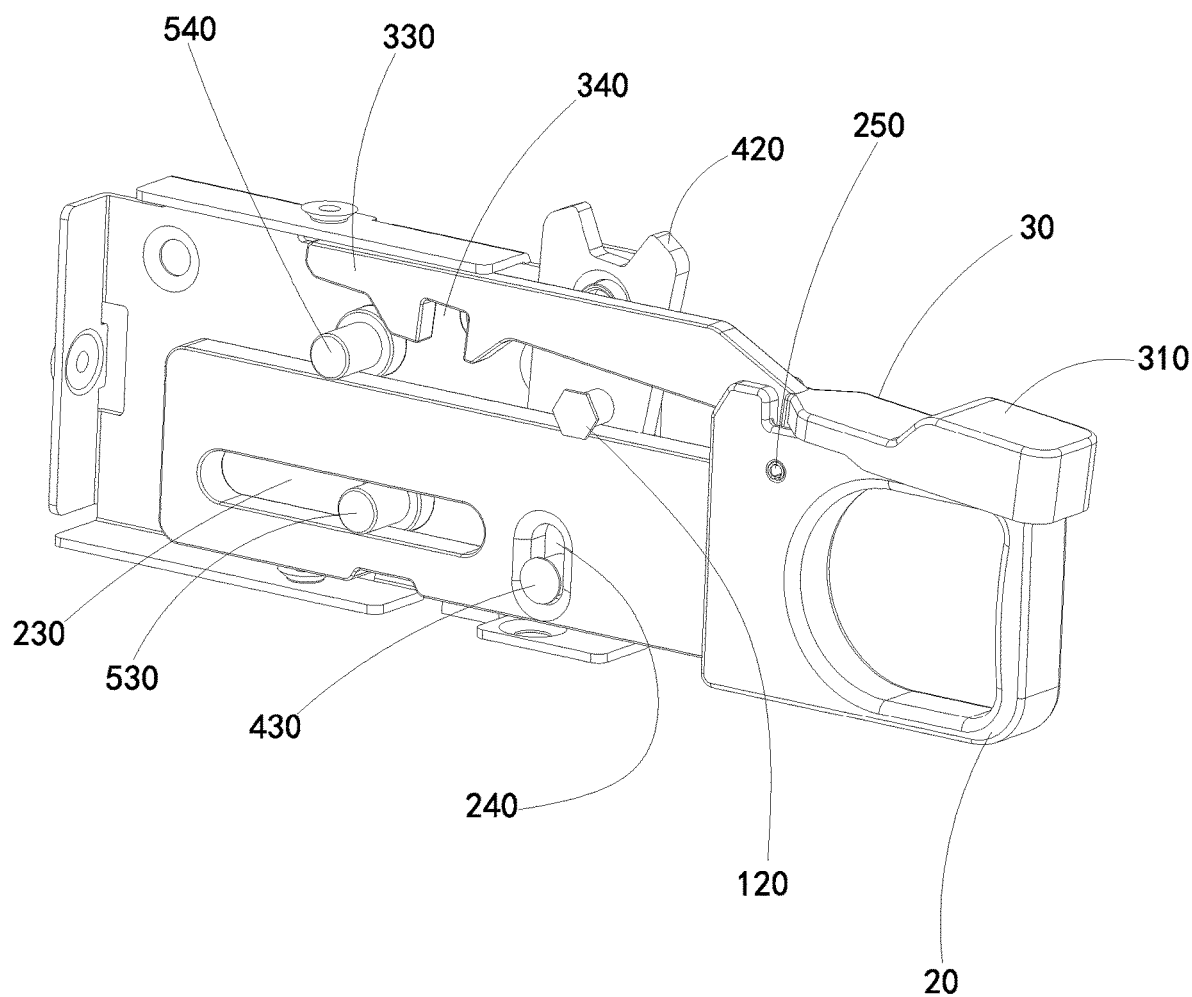
FIG. 5 illustrates a partial view of the sliding apparatus of FIG. 2, the sliding apparatus being in a second state.
Figure 6:
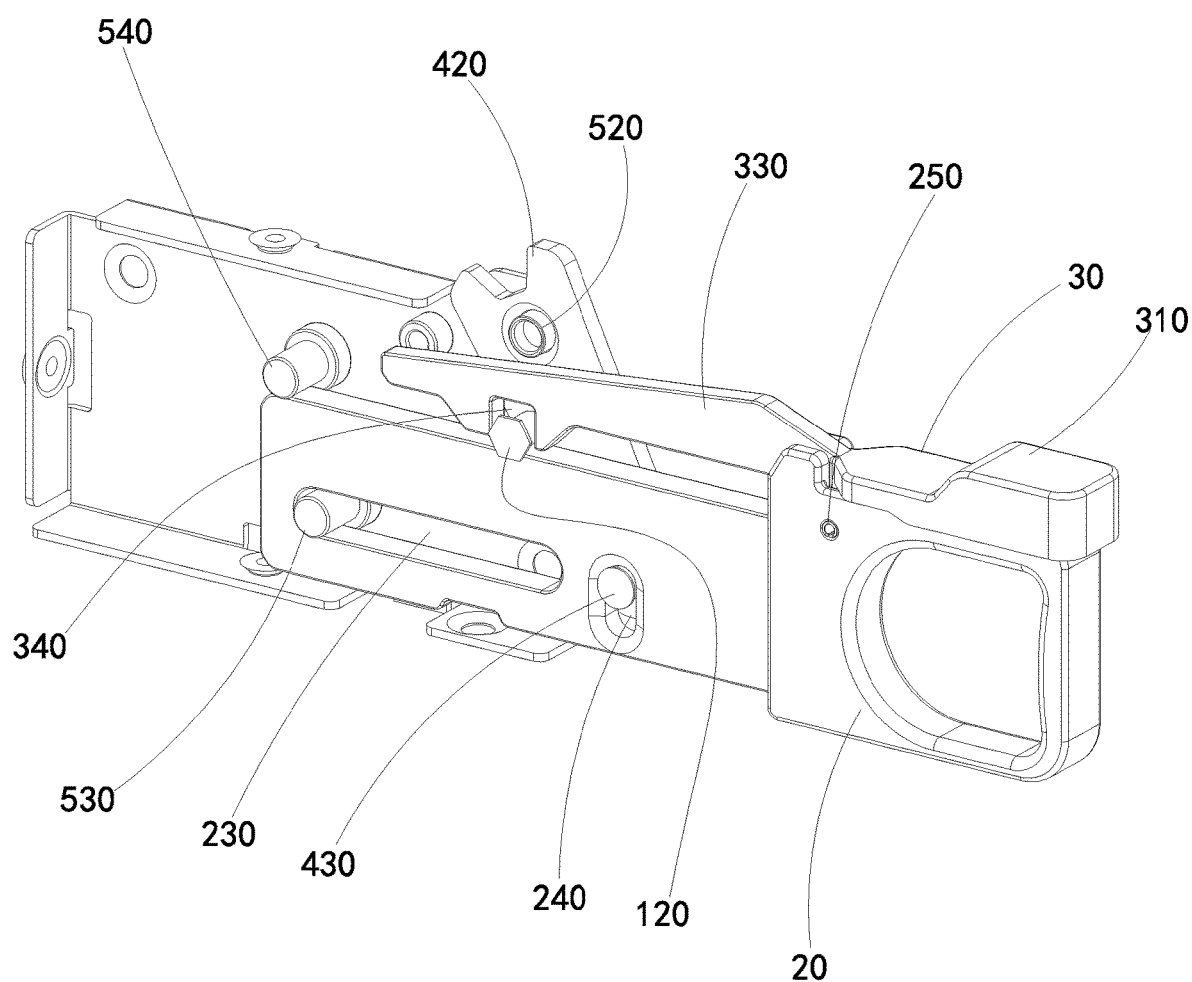
FIG. 6 illustrates a partial view of the sliding apparatus of FIG. 2, the sliding apparatus being in a third state.

When the sliding plate 20 slides on the second fastening plate 50, the sliding plate 20 drives the first end of the locking member 40 to rotate through the second end of the locking member 40. The first end of the locking member 40 drives the locking portion 420 to move between a locked position (as shown in FIG. 4), where the locking member 40 is locked by the blocking member 201, and an unlocked position (as shown in FIG. 6), where the locking member 40 is unlocked by the blocking member 201.

The sliding plate 20 can define a first guiding slot 230 along an extending direction of the sliding plate 20. Correspondingly, the second fastening plate 50 can include a guiding member 530, and the guiding member 530 is slidably received in the first guiding slot 230.

The locking member 40 can be a swing arm. The locking member 40 can further include a swing pole 440. The locking portion 420 can be located on a first end of the swing pole 410, the second end of the swing pole 410 can include a sliding portion 430.

The sliding plate 20 defines a second guiding slot 240. The second guiding slot 240 extends along a direction perpendicular to a sliding direction of the sliding plate 20. The sliding portion 430 is slidably received in the second guiding slot 240.

When the sliding plate 20 slides on the second fastening plate 50, the sliding plate 20 drives the sliding portion 430 through the second guiding slot 240.

The sliding plate 20 can include a sliding board 220 and a holder 210 connected to an end of the sliding board 220. The first guiding slot 230 and the second guiding slot 240 are defined on the sliding board 220.

In at least one exemplary embodiment, the sliding apparatus 100 can further include a latching member 30. The latching member 30 is connected to the sliding plate 20 and can move along with the sliding plate 20. The second fastening plate 50 can further include a first latching portion 120 and a second latching portion 540 corresponding to the latching member 30.

When the locking portion 420 is driven to move to the locking position, the latching member 30 is locked by one of the two latching portions, such as the second latching portion 540. When the locking portion 420 is driven to move to the unlocking position, the latching member 30 is locked by the other one of the two latching portions, such as the first latching portion 120.

The latching member 30 can include a cantilever 330 and a handle 310. The cantilever 330 includes two opposing ends. The handle 310 is connected to an end of the cantilever 330, the other end of the cantilever 330 is rotatably connected to the sliding plate 20. The other end of the cantilever 330 defines a latching slot 340 corresponding to the first latching portion 120 and the second latching portion 540.

When the locking portion 420 is driven to move to the locking position, the latching slot is locked by the second latching portion 540. When the locking portion is driven to move to the unlocking position, the latching slot is locked by the first latching portion 120.

An end of the cantilever 330 defines a first pivot hole 320. The holder 210 includes a first pivot pin 250 corresponding to the first pivot hole 320, and the cantilever 330 is rotatably connected to the holder 210 through the first pivot pin 250 and the first pivot hole 320.

In at least one exemplary embodiment, the sliding apparatus 100 can further include a resilient member 60. The resilient member 60 can be connected between the holder 210 and the handle 310.

When the handle 310 is pressed to the holder 210, the cantilever 330 rotates about the pivot pin 250 and drives the latching slot 340 to separate from one of the two latching portions, the resilient member 60 being elastically deformed. When the handle 310 is released, the resilient member 60 drives the cantilever 330 to rotate in reverse under restoring force, and the latching slot 340 is driven to be locked by one of the two latching portions.

The locking member 40 defines a second pivot hole 440. The second fastening plate 50 can include a second pivot pin 520 corresponding to the second pivot hole 440, and the locking member 40 is rotatably connected to the second fastening plate 50 through the second pivot pin 520 and the second pivot hole 440.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A sliding apparatus comprising:
    a first fastening plate;
    a second fastening plate parallel with the first fastening plate and mounted to the first fastening plate;
    a sliding plate configured to be slidably connected to the second fastening plate and be received between the first fastening plate and the second fastening plate;
    a locking member comprising a first end and a second end opposing to the first end;
    wherein the first end is rotatably connected to the second fastening plate and comprising a locking portion, the second end is connected to the sliding plate; when the sliding plate slides on the second fastening plate, the sliding plate drives the first end to rotate through the second end, and the first end drives the locking portion to move between a locking position and an unlocking position, wherein the sliding plate defines a first guiding slot along an extending direction of the sliding plate; the second fastening plate comprises a guiding member, and the guiding member is slidably received in the first guiding slot.

2. The sliding apparatus of claim 1, wherein the locking member is a swing arm comprising a swing pole, the locking portion is located on the first end of the swing pole, the second end of the swing pole comprises a sliding portion;
    the sliding plate defines a second guiding slot, the second guiding slot extends along a direction perpendicular to a sliding direction of the sliding plate; the sliding portion is slidably received in the second guiding slot;
    when the sliding plate slides on the second fastening plate, the sliding plate drives the sliding portion through the second guiding slot.

3. The sliding apparatus of claim 1, wherein the sliding plate comprises a sliding board and a holder connected to an end of the sliding board.

4. The sliding apparatus of claim 3, wherein the sliding apparatus further comprises a latching member connected to the sliding plate; the second fastening plate further comprises two latching portions corresponding to the latching member;
    when the locking portion is driven to move to the locking position, the latching member is locked by one of the two latching portions; when the locking portion is driven to move to the unlocking position, the latching member is locked by the other one of the two latching portions.

5. The sliding apparatus of claim 4, wherein the latching member comprises:
    a cantilever comprising two opposing ends;
    a handle connected to an end of the cantilever;
    wherein the other end of the cantilever is rotatably connected to the sliding plate and defines a latching slot corresponding to the two latching portions;
    when the locking portion is driven to move to the locking position, the latching slot is locked by one of the two latching portions; when the locking portion is driven to move to the unlocking position, the latching slot is locked by the other one of the two latching portions.

6. The sliding apparatus of claim 5, wherein an end of the cantilever defines a first pivot hole; the handle comprises a first pivot pin corresponding to the first pivot hole; and the cantilever is rotatably connected to the handle through the first pivot pin and the first pivot hole.

7. The sliding apparatus of claim 6, wherein the sliding apparatus further comprises a resilient member connected between the handle and the holder;
    when the handle is pressed to the holder, the cantilever rotates about the pivot pin and drives the latching slot to separate from one of the two latching portions, and the resilient member is elastically deformed; when the handle is released, the resilient member drives the cantilever to rotate in reverse under restoring force, and the latching slot is driven to be locked by one of the two latching portions.

8. The sliding apparatus of claim 1, wherein the locking member defines a pivot hole; the second fastening plate comprises a pivot pin corresponding to the pivot hole; and the locking member is rotatably connected to the second fastening plate through the pivot pin and the pivot hole.

9. A server casing comprising:
    a chassis comprising a blocking member; and
    a sliding apparatus comprising:
        a first fastening plate;
        a second fastening plate parallel with the first fastening plate and mounted to the first fastening plate;
        a sliding plate configured to be slidably connected to the second fastening plate and be received between the first fastening plate and the second fastening plate;

a locking member comprising a first end and a second end opposing to the first end;

wherein the first end is rotatably connected to the second fastening plate and comprising a locking portion, the second end is connected to the sliding plate; when the sliding plate slides on the second fastening plate, the sliding plate drives the first end to rotate through the second end, and the first end drives the locking portion to move between a locking position, where the locking member is locked by the blocking member, and an unlocking position, where the locking member is unlocked by the blocking member.

10. The server casing of claim 9, wherein the sliding plate defines a first guiding slot along an extending direction of the sliding plate; the second fastening plate comprises a guiding member, and the guiding member is slidably received in the first guiding slot.

11. The server casing of claim 9, wherein the locking member is a swing arm comprising a swing pole, the locking portion is located on the first end of the swing pole, the second end of the swing pole comprises a sliding portion;

the sliding plate defines a guiding slot, the second guiding slot extends along a direction perpendicular to a sliding direction of the sliding plate; the sliding portion is slidably received in the guiding slot;

when the sliding plate slides on the second fastening plate, the sliding plate drives the sliding portion through the second guiding slot.

12. The server casing of claim 9, wherein the sliding plate comprises a sliding board and a holder connected to an end of the sliding board.

13. The server casing of claim 12, wherein the sliding apparatus further comprises a latching member connected to the sliding plate; the second fastening plate further comprises two latching portions corresponding to the latching member;

when the locking portion is driven to move to the locking position, the latching member is locked by one of the two latching portions; when the locking portion is driven to move to the unlocking position, the latching member is locked by the other one of the two latching portions.

14. The server casing of claim 13, wherein the latching member comprises:

a cantilever comprising two opposing ends;

a handle connected to an end of the cantilever;

wherein the other end of the cantilever is rotatably connected to the sliding plate and defines a latching slot corresponding to the two latching portions;

when the locking portion is driven to move to the locking position, the latching slot is locked by one of the two latching portions; when the locking portion is driven to move to the unlocking position, the latching slot is locked by the other one of the two latching portions.

15. The server casing of claim 14, wherein an end of the cantilever defines a first pivot hole; the handle comprises a first pivot pin corresponding to the first pivot hole; and the cantilever is rotatably connected to the handle through the first pivot pin and the first pivot hole.

16. The server casing of claim 15, wherein the sliding apparatus further comprises a resilient member connected between the handle and the holder;

when the handle is pressed to the holder, the cantilever rotates about the pivot pin and drives the latching slot to separate from one of the two latching portions, and the resilient member is elastically deformed; when the handle is released, the resilient member drives the cantilever to rotate in reverse under restoring force, and the latching slot is driven to be locked by one of the two latching portions.

17. The server casing of claim 10, wherein the locking member defines a pivot hole; the second fastening plate comprises a pivot pin corresponding to the pivot hole; and the locking member is rotatably connected to the second fastening plate through the pivot pin and the pivot hole.

* * * * *